United States Patent [19]

Cocks et al.

[11] Patent Number: 5,308,801
[45] Date of Patent: May 3, 1994

[54] PROCESS FOR THE INCREASE IN CRITICAL TEMPERATURE OF HIGH $T_c$ SUPERCONDUCTORS

[75] Inventors: F. Hadley Cocks, Durham; Nancy J. Bolinger, Chapel Hill; Holly M. Hammarstrom, Durham, all of N.C.

[73] Assignees: Duke University, Durham, N.C.; IBM Corporation, Armonk, N.Y.

[21] Appl. No.: 918,556

[22] Filed: Jul. 22, 1992

[51] Int. Cl.$^5$ .............................................. B05D 5/12
[52] U.S. Cl. .................................... 505/310; 505/730; 505/731; 505/780; 505/781; 505/476; 505/300; 427/62
[58] Field of Search .................... 505/1, 730, 731, 742, 505/780, 781; 427/62, 63

[56] References Cited

PUBLICATIONS

Crommie et al, "C-Axis Stress Dependence of Normal and Superconducting State Properties of $YBa_2Cu_3O_7$", Physical Review B, 39(7) Mar. 1989 pp. 4231-4234.

Bud'ko et al, "Uniaxial Pressure Dependence of the Superconducting Critical Temperature in $RBa_2Cu_3O_{7-\delta}$ High-$T_c$ Oxides", Physical Review B, 46(2) Jul. 1992 pp. 1257-1260.

Okai et al, "Effect of Pressure on Superconducting Transition Temperature of $Y_{0.4}Ba_{0.6}CuO_y$," Jpn. J. Appl. Phys. 261(5), May 1987, L820-821.

Meingast et al, Physical Review Letters, "Large a-b Anistrophy of the Expansivity Anomaly at $T_c$ in Untwinned $YBa_2Cu_3O_{7-\delta}$", vol. 67, No. 12, Sep. 1991, pp. 1634-1637.

Cava et al., Physical Review B, "Single-phase 60-K Bulk Superconductor In Annealed $Ba_2YCU_3O_{7-\delta}$", vol. 36, No. 10, Oct. 1987, pp. 5719-5722.

Chu et al., Physical Review Letters, "Evidence for Superconductivity Above 40K In The La-Ba-Cu-O Compound System", vol. 58, No. 4, Jan. 1987, pp. 405-407.

Xu et al., Physical Review B, "Microstructure, Lattice Parameters, and Superconductivity of $YBa_2(Cu_{1-x}Fe_x)_3O_{7-\delta}$ For $0 \leq x \leq 0.33$", vol. 39, No. 10, Apr. 1989, pp. 6667-6680.

*Primary Examiner*—Roy V. King
*Attorney, Agent, or Firm*—Richard E. Jenkins

[57] ABSTRACT

A method is disclosed to increase the critical transition temperature of superconducting materials by the selective application of stress to specific crystal directions. It has been found that by applying tensile stresses in certain directions and compressive stresses in other directions that the critical temperature of superconducting materials can be substantially increased.

3 Claims, No Drawings

PROCESS FOR THE INCREASE IN CRITICAL TEMPERATURE OF HIGH $T_c$ SUPERCONDUCTORS

TECHNICAL FIELD

The present invention relates to a process providing for an increase in the critical transition temperature of superconducting materials by selective application of stress to specific predetermined crystal directions.

RELATED ART

The recent discovery that certain ceramic materials can show superconductivity above 77 degrees Kelvin has stimulated a significant increase in superconductivity research. This research has focused especially on the increase in the critical temperature of these high temperature superconducting materials.

Hydrostatic pressure and different atomic compositions, that is, different chemical compositions, have long been known to affect the superconducting transition temperatures of high temperature superconductors. However, no definitive theory yet exists to explain these effects quantitatively, especially the influence of lattice parameter changes on critical temperatures. The results of applicants' invention offer a new phenomenological approach toward predicting the effect of stress-induced lattice parameter changes on superconducting critical temperatures and a new process for increasing the transition temperature of high temperature superconducting materials.

DISCLOSURE OF THE INVENTION

A method for increasing the critical transition temperature of a high temperature superconducting material having three crystal axes, said method comprising the steps of (1) providing a selected high temperature superconducting material; and (2) applying non-hydrostatic stressing to said superconducting material comprising unequal stresses in the direction of at least two of said three crystal axes. To determine the best crystal directions in which to apply the stress and the concomitant strain, the dependence of critical temperature on lattice parameter is first calculated using the variation in lattice parameters and critical temperatures which occur as a function of chemical composition.

BEST MODE FOR CARRYING OUT THE INVENTION

A. The Physics of the Method

Chu, et al. (C. W. Chu, P. H. Hor, R. L. Meng, L. Gao, Z. J. Huang, and Y. Q. Wang, *Physical Review Letters*, 58, 405 (1987) demonstrated that critical temperatures in the La-Ba-Cu-O system have a strong dependence on pressure, and many hydrostatic studies have been made of this effect. These studies have shown a wide variation in the response of high temperature superconductors to hydrostatic pressure, and both positive and negative effects have been reported, even for nominally the same material. In addition, many studies have been made to investigate the influence of compositional changes on critical temperature. In particular, the crucial role of oxygen has been studied extensively. Both physical pressure and chemical pressure can produce changes in lattice parameter, and a large number of lattice parameter studies have been carried out.

None of these studies have attempted to relate critical temperature to lattice parameter in the manner described by applicants herein or to produce increased transition temperatures by the selective application of unequal stress in at least two different crystal directions. In the present invention, quantitative expressions relating critical temperature as a function of the lattice parameters of the orthorhombic unit cells of $YBa_2Cu_3O_{7-x}$ and $YBa_2(Cu_{1-x}Fe_x)_3O_{7-y}$ are calculated, assuming a linear dependence of these variables, and these calculations are then used to determine in which directions stress and strain are to be applied in order to increase the transition temperature and to determine the sign, whether positive or negative, that these stresses and strains must have.

As an example of the determination of these quantitative relationships, a least squares analysis has been carried out to relate critical temperature, $T_c$, and room temperature lattice parameters, a, b, and c, for the compounds $YBa_2Cu_3O_{7-x}$ and $YBa_2(Cu_{1-x}Fe_x)_3O_{7-y}$. Of course, the lattice parameters at the transition temperature would be preferable, but there is usually insufficient low temperature lattice parameter data to enable such a calculation to be made.

A linear model of the following form is assumed:

$$T_c - T_{co} = k_1(a - a_o) + k_2(b - b_o) + k_3(c - c_o), \quad (1)$$

wherein $T_{co}$ is the mean critical temperature of the data set, and $a_o$, $b_o$, and $c_o$ are the mean values of the corresponding lattice parameters a, b, and c.

The data selected for the analysis of orthorhombic $YBa_2Cu_3O_{7-x}$ were that of Cava, et al. (R. J. Cava, B. Batlogg, C. H. Chen, E. A. Rietman, S. M. Zahurak, and D. Werder, *Phys. Rev. B* 39, 5719 {1987}), which consists of eight data points within $0.0 \leq x \leq 0.7$. The seven data points used in the case of orthorhombic $YBa_2(Cu_{1-x}Fe_x)_3O_{7-y}$ were taken from Xu, et al. (Youwen Xu, M. Suenaga, J. Tafto, R. L. Sabatini, A. R. Moodenbaugh, and P. Zolliker, *Phys. Rev. B* 39, 6667 {1989}). In both cases, the critical temperature data were read from the given graphical data. All numerical data used for both cases are shown in Tables I and II set forth below.

TABLE I

Data used in regression analysis for $YBa_2Cu_3O_{7-x}$, taken from Cava, et al.

| a (Ångstroms) | b (Ångstroms) | c (Ångstroms) | $T_c$ (Kelvin) |
| --- | --- | --- | --- |
| 3.822 | 3.891 | 11.677 | 92 |
| 3.827 | 3.895 | 11.722 | 86 |
| 3.830 | 3.898 | 11.728 | 77 |
| 3.835 | 3.890 | 11.716 | 60 |
| 3.831 | 3.889 | 11.736 | 58 |
| 3.838 | 3.887 | 11.747 | 55 |
| 3.845 | 3.887 | 11.768 | 44 |
| 3.851 | 3.883 | 11.789 | 28 |

TABLE II

Data used in regression analysis for $YBa_2(Cu_{1-x}Fe_x)_3O_{7-y}$, taken from Xu, et al.

| a (Ångstroms) | b (Ångstroms) | c (Ångstroms) | $T_c$ (Kelvin) |
| --- | --- | --- | --- |
| 3.820 | 3.885 | 11.676 | 90 |
| 3.822 | 3.885 | 11.680 | 90 |
| 3.825 | 3.885 | 11.672 | 89.5 |
| 3.829 | 3.881 | 11.678 | 86.5 |
| 3.834 | 3.879 | 11.677 | 86 |
| 3.842 | 3.868 | 11.678 | 86 |
| 3.852 | 3.861 | 11.686 | 83 |

Applicants have taken lattice parameters in order of increasing lattice parameter magnitude such that the smallest lattice parameter is termed a and the largest parameter is c.

The least squares analysis of the data in Table I for $YBa_2Cu_3O_{7-x}$ gives the result that the critical superconducting transition temperature of this compound as a function of lattice parameter:

$$Tc - 62.5 = -1183.4(a - 3.835 \text{Å}) = 1221.8(b - 3.890 \text{Å}) - 158.7(c - 11.735 \text{Å}), \quad (2)$$

while the data from Table II for $YBa_2(Cu_{1-x}Fe_x)_3O_{7-y}$ give:

$$Tc - 87.29 = -428.8(a - 3.832 \text{Å}) - 299.7(b - 3.877 \text{Å}) - 113.6(c - 11.678 \text{Å}), \quad (3)$$

The temperature is in degrees Kelvin and the lattice parameters are in Angstroms.

Several suggestive conclusions may be drawn from these equations. The presence of both positive and negative signs in Eq. (2) immediately implies a strong anisotropic dependence of critical temperature on lattice parameter. The presence of the same sign before each of the terms in Eq. (3) implies a less strong anisotropy; however, the fact that the coefficients are not equal implies that anisotropy is present. These relationships between lattice parameters and critical temperatures result, of course, from data derived from changes in composition. Such changes have been interpreted in terms of "chemical pressure" effects. With respect to a physical pressure, the mix of positive and negative signs in the constants affords an explanation of the small dependence on hydrostatic pressure of the critical temperature of $YBa_2Cu_3O_{7-x}$. That is, because both positive and negative signs are present, the application of uniform (hydrostatic) pressure to the crystal causes effects which tend to cancel. To obtain the maximum increase in critical temperature, applied is compressive strain in those crystal lattice parameter directions which exhibit a negative effect on the transition temperature and applied is a tensile strain in those crystal lattice directions which exhibit a positive effect on transition temperature.

If the elastic constants for single crystal $YBa_2Cu_3O_{7-x}$ were known, the exact hydrostatic pressure dependence of the critical temperature predicted by Eq. (2) could be calculated. However, none of the single crystal elastic constants appear to be known for this orthorhombic compound. Applicants, however, have assumed that the unit cell decreases uniformly in each direction with pressure and that the bulk modulus of a crystal is approximately the same as that of polycrystalline aggregate (which is only an approximate assumption), then the pressure dependence of the critical temperature predicted by Eq. (1) is $$\frac{dT_c}{dP} = \sum_1^3 k_i \frac{dL_i}{dP} + L_i \frac{dk_i}{dP}, \quad (4)$$

In this equation applicants have used $L_i$ to represent the lattice constants a, b, and c for simplicity.

Applicants then neglect the variation in the constants $k_i$ with pressure, and use the a, b, and c notation, and Eq. (4) becomes:

$$\frac{dT_c}{dP} = k_1 \frac{da}{dP} + k_2 \frac{db}{dP} + k_3 \frac{dc}{dP}. \quad (5)$$

Remembering that the bulk modulus, $\beta$, is given by $$\beta = \frac{\Delta P}{\frac{\Delta V}{V}} = \frac{\Delta P}{\epsilon_a + \epsilon_b + \epsilon_c}, \quad (6)$$

where $x_a$, $x_b$, and $x_c$ are strains in the a, b, and c directions. Applicants assume these strains to be approximately equal to obtain $$\epsilon_a \approx \epsilon_b \approx \epsilon_c = \epsilon = \frac{\Delta a}{a}. \quad (7)$$

Therefore, $$\beta = \frac{\Delta P}{\frac{3\Delta a}{a}}, \quad (8)$$

so that $$\frac{\Delta a}{\Delta P} = \frac{a}{3\beta}. \quad (9)$$

Similar results hold for the other parameters, and the final result is $$dT_c/dP = \sum_1^3 \frac{k_i}{3\beta L_i} = \frac{1}{\beta}\left(\frac{a_o k_1}{3} + \frac{b_o k_2}{3} + \frac{c_o k_3}{3}\right) \quad (10)$$

Equation (10) may be evaluated for both $YBa_2Cu_3O_{7-x}$ and $YBa_2(Cu_{1-x}Fe_x)_3O_{7-y}$ using the constants given by Eqs. (2) and (3), taking the bulk modulus as 196 GPa. For $YBa_2Cu_3O_{7-x}$ the result is $$\frac{dT_c}{dP} = +2.7 \, K/GPa. \quad (11)$$

To obtain this result applicants have used the average $a_o$, $b_o$, and $c_o$ values, and it should be noted that the positive sign in Eq. (11) results from the fact that pressure causes a negative strain. This calculated value is greater in magnitude than any of the reported experimental values, a result that is most likely due to the sensitivity of this calculated value to the assumption of equal strains for each of the three crystal axes, a result that is unlikely to be true. It is, however, a reasonable assumption to take the moduli of $YBa_2(Cu_{1-x}Fe_x)_3O_{7-x}$ as being similar to those of $YBa_2Cu_3O_{7-x}$, since moduli are generally not more than a linear function of composition. In this case, if one calculates the pressure dependence of $YBa_2(Cu_{1-x}Fe_x)_3O_{7-y}$, making the same assumptions as in the case of $YBa_2Cu_3O_{7-x}$, then the ratio of the calculated pressure dependence of the critical temperature of these two compounds can be estimated. Using the results from Eq. 3 gives the pressure dependence of the iron-doped compound as:

$$\frac{dT_c}{dP} = +7.0 \, K/GPa. \quad (11)$$

Thus, the ratio of the pressure dependence of the critical temperatures of $YBa_2(Cu_{1-x}Fe_x)_3O_{7-y}$ to that of $YBa_2Cu_3O_{7-x}$ is 7.0 to 2.7, or ~2.6.

These calculations, even with their many assumptions, indicate that the pressure dependence of the critical temperature for $YBa_2(Cu_{1-x}Fe_x)_3O_{7-y}$ should be higher than that for $YBa_2Cu_3O_{7-x}$. There is experimental evidence that this is indeed the case.

The expression in Eq. (2) shows that non-hydrostatic stressing could increase the critical temperature of $YBa_2Cu_3O_{7-x}$ much more strongly than hydrostatic stressing can per unit of applied stress. Triaxial stresses which consisted of tension in the b direction and compression in the a and c directions would clearly raise the critical temperature more per unit of applied stress than would the same average stress magnitude applied hydrostatically, assuming that this triaxial stress were applied to a spectrum whose a, b, and c axes were greater than $a_o$, $b_o$, and $c_o$, respectively. Although substantial extrapolations utilizing Eq. (2) will clearly be inaccurate, it is interesting to calculate the stresses needed along the three directions a, b, and c to produce superconductivity at room temperature. From Eq. (2), only the coefficient for the b axis is positive. To reduce the negative contribution from the a axis to zero requires, for the sample having $T_c = 92°$ K (and for which $a = 3.822$, $b = 3.891$, and $c = 11.677$) a positive strain of 0.0034 $((a - a_o)/a_o = -0.0043)$, in which case the numerical value of a under this positive strain equals 3.835 Å so that this axis has the average $a_o$ value and this term becomes zero. Assuming a Young's Modulus in the a direction of 100 Gpa, this strain could be produced by a positive stress of 0.34 GPa (49,000 psi).

With the same Young's Modulus assumed in the c direction, a positive stress of 0.49 GPa (71,000psi) would also reduce the c-axis contribution to zero, of course neglecting Poison's Ratio effects which would arise from the positive stress in the a direction inasmuch as the Young's Moduli in both of these directions are only being assumed in any event. Under these same assumptions (Poison's Ratio of zero and equal moduli) then requiring that the contributions from the b direction gives a transition temperature of 300° K yields the needed strain in this direction as +0.05 and the required tensile (positive) stress as 5.0 GPa (725,000 psi). This last stress is, of course, enormous.

Varying estimates of the theoretical strength of solids are available, and these estimates suggest that the theoretical shear strength of solids lies between G/10 and G/50, where G is the shear modulus. Estimates of the theoretical "cohesive" strength are higher and are on the order of E/10, where E is Young's Modulus. The cohesive strength estimates the maximum force needed to completely break atomic bonds in solids, not merely shear them, and is thus greater than the theoretical shear strength. Taking the shear modulus as 35 GPa and again ignoring Poison's Ratio effects gives a maximum possible applied shear stress between 3.5 and 0.7 GPa, which is not high enough to produce room temperature superconductivity even under the assumptions just made. However, for highly perfect, dislocation-free crystals stressed in more than one direction in such a way that the shear stress is reduced (becoming zero under either hydrostatic tension or compression) it is the cohesive strength, not the shear strength, that becomes limiting, in which case the extrapolation of Eq. (2) to predict the possibility of room temperature superconductivity is not a priori impossible, since E/10 will be approximately 10 GPa. It is worth noting too, that in the case of either triaxial tension or triaxial compression, the shear stresses which are produced are progressively reduced as the magnitude of the triaxial stresses approach one another, until in the result of either hydrostatic tension or hydrostatic compression no shear stress at all is produced as a result of the applied stress, in which case, dislocations, even if they were present, would be sessile.

Triaxial stresses, although they may be unequal, can till have a hydrostatic stress component, provided that these stresses are all of the same sign, and in this event higher absolute stress levels than the maximum possible shear stress are in fact, theoretically possible, up to the limit of the maximum cohesive stress, even in the case of materials which contain dislocations. Of course, if stresses of opposite sign are applied along the three crystal axes, then via a Mohr's Circle argument it is easily seen that the resulting shear stress would be increased, not decreased, as the magnitudes of the three stresses approached one another. Also, it is not to be expected that the linear relationship assumed here will be valid over even a small portion of the extreme range of such an extrapolation. This calculation only demonstrates the possible potential of non-hydrostatic as opposed to hydrostatic stressing in raising critical temperatures.

Of course, it is not to be expected that gross extrapolations to room temperature such as applicants have described here will be found to be numerically correct. This calculation is instructive, however, in revealing a new process for increasing transition temperatures that has not been previously recognized. In general according to the method of increasing the critical temperature described here for certain superconducting materials it appears that the critical temperature does not respond equally or even with the same sign, to the separate lattice parameter dimensions. Therefore, by applying different stresses and strains, positive, negative or both positive in one or more directions or negative in one or more directions such that unequal stresses in the direction of three or at least two of the crystal axes, the crystal transition temperature can be controlled in either a positive, decreasing or a negative, decreasing manner.

B. Preferred Embodiments

In a preferred embodiment of the present invention, a thin film of $YBa_2Cu_3O_x$ is deposited onto a thin crystal substrate of yttria stabilized zirconia by high frequency sputtering of an $YBa_2Cu_3O_x$ sputtering target in low pressure oxyqen using a 13.2 MHz high frequency power source, until the resulting $YBa_2Cu_3O_x$ film is approximately 2000Å thick and is epitaxially deposited upon the substrate such that the c-axis of the crystalline epitaxial film of $YBa_2Cu_3O_x$ is normal to the surface of the substrate.

The orientation of both the substrate and the film is determined by back-reflection x-ray Laue means. The lattice parameters of the film are determined also by x-ray diffraction using a diffractometer and the a-axis of the $YBa_2Cu_3O_x$ film is found to possess a lattice parameter of 3.830Å while the b-axis is found to possess a lattice parameter of 3.898Å and the c-axis is found to possess a lattice parameter of 11.728Å. Using a four-point probe electrical conductivity test the transition temperature of the $YBa_2Cu_3O_x$ film is found to be 77° K. The combination composite of film and substrate are then bent such that the film of $YBa_2Cu_3O_x$, is on the inside of the bend and the yttria stabilized zirconia substrate is on the outside of the bend. Also, this bending is only around one axis of the film/substrate composite and is aligned such that the a-axis of the crystalline epitaxial film of $YBa_2Cu_3O_x$ is under compression and is found to be decreased such that when its lattice parameter is measured a second time using back-reflection x-ray diffraction it is found to be 3.829Å, along the a-axis. When the critical temperature of the film is measured again, while the composite film/substrate is still bent as described, using once again a four-point probe method it is found that the critical transition temperature of the crystalline epitaxial film of $YBa_2Cu_3O_x$ is increased by more than one degree centigrade as a result of this uniaxial stressing caused by the bending of the high temperature superconducting film as described.

It is to be noted that in uniaxial stressing such as is applied in this case that the lattice parameters in the other two directions will still undergo a change in value even though there is no applied stress in these directions because of the Poison's ratio effect by which the strain in a direction normal to the applied stress direction will be of opposite sign and of a magnitude typically one third of that strain produced in the direction in which the stress is applied.

In a second preferred embodiment of the present invention, a single crystal of $YBa_2Cu_3O_x$ is annealed in oxygen until its superconducting transition temperature is 92° K and its a-axis lattice parameter is 3.822Å, its b-axis lattice parameter is 3.891Å and its c-axis lattice parameter is 11.677Å. It will be found that if this crystal is stressed in tension in a direction parallel to its b-axis until the lattice parameter in this direction has a value of 3.892Å that the superconducting transition temperature will be raised by more than one and one-half degrees Kelvin by this uniaxial stressing.

It is to be understood in these preferred embodiments that even though only stressing along one axis has been applied, that stressing in two axes or even stressing in three axes can be utilized, provided that if stressing in three perpendicular axes is used that the stresses produced in these three axes are not equal in magnitude.

It is also to be understood that increases in the critical temperature by applying stresses that are equal in magnitude in each of the three crystal directions provided however that these stresses are not equal in sign.

In a third preferred embodiment of this invention a single crystal of $YBa_2Cu_3O_x$ is annealed in oxygen until its superconducting transition temperature is 92° K and its a-axis lattice parameter is 3.822Å, its b-axis lattice parameter is 3.891Å and its c-axis lattice parameter is 11.677Å. It will be found that if this crystal is stressed in compression in a direction parallel to its a-axis until the lattice parameter in this direction has a value of 3.821Å while at the same time it is stressed in tension in a direction parallel to its b-axis until the lattice parameter in this direction has a value of 3.892Å and stressed in compression in a direction parallel to its a-axis until the lattice parameter in this direction has a value that is 11.676Å, the superconducting transition temperature will be raised by more than two and one-half degrees Kelvin by this triaxial stressing.

In a fourth preferred embodiment, a single crystal of $YBa_2(Cu_{1-x}Fe_x)_3O_{7-y}$ which without stressing has a critical transition temperature of 86.5° K, is stressed in tension parallel to each of the three axes a, b, and c such that each axis is increased in length by 0.001Å. When the superconducting transition temperature of this crystal is determined while this crystal is under stress it is found that the critical transition temperature is decreased by approximately 0.8° K. Conversely, when this crystal is put under unequal compressive stress such that the three axes of the crystal are each reduced by 0.001Å, it is found that the critical transition temperature in increased by approximately 0.8° K.

In summary, applicants have proposed a new process that may be applied to any superconducting material for which the critical transition temperature depends upon crystal dimensions and which suggests a phenomenological method for the prediction of hydrostatic pressure effects and gives an indication that non-hydrostatic stressing could be more effective in increasing critical transition temperatures than hydrostatic stressing alone.

It will be understood that various details of the invention may be changed without departing from the scope of the invention. Furthermore, the foregoing description is for the purpose of illustration only, and not for the purpose of limitation—the invention being defined by the claims.

What is claimed is:

1. A method for increasing the critical transition temperature of a high temperature superconducting material having three crystal axes, said method comprising the steps of:
   (a) providing the high temperature superconducting material; and
   (b) applying nonhydrostatic stressing to said superconducting material by providing tension in the direction of one crystal axis and compression in the direction of at least one of the other two crystal axes.

2. A method according to claim 1 wherein step (a) comprises providing a superconducting material selected from the group consisting of $YBa_2Cu_3O_{7-y}$, and $YBa_2(Cu_{1-x}Fe_x)_3O_{7-y}$ wherein $0.0 < x' < 0.7$, $0 < x < 0.33$, and $0.0 < y < 0.7$.

3. A method for increasing the critical transition temperature of a high temperature superconducting material having three crystal axes, said method comprising the steps of:
   (a) providing a high temperature superconducting material which exhibits different superconducting transition temperatures at different chemical compositions;
   (b) measuring the lattice parameters exhibited by said high temperature superconducting material as a function of said different chemical compositions;
   (c) measuring said different superconducting transition temperatures at said different chemical compositions;
   (d) calculating the dependence of said superconducting transition temperatures upon said lattice parameters;
   (e) applying compressive strain in those crystal lattice parameter directions which exhibit a negative effect on said transition temperatures; and
   (f) applying a tensile strain in those crystal lattice directions which exhibit a positive effect on said transition temperatures whereby said superconducting transition temperatures are increased.

* * * * *